(12) United States Patent
Akram et al.

(10) Patent No.: US 7,253,957 B2
(45) Date of Patent: Aug. 7, 2007

(54) INTEGRATED OPTICS UNITS AND METHODS OF MANUFACTURING INTEGRATED OPTICS UNITS FOR USE WITH MICROELECTRONIC IMAGERS

(75) Inventors: Salman Akram, Boise, ID (US); Peter A. Benson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/845,303

(22) Filed: May 13, 2004

(65) Prior Publication Data
US 2005/0254133 A1    Nov. 17, 2005

(51) Int. Cl.
*G02B 27/10* (2006.01)
*H01L 21/00* (2006.01)
(52) U.S. Cl. .................. 359/619; 438/69; 438/462
(58) Field of Classification Search ........ 359/619–626; 438/27, 65, 68, 69, 462
See application file for complete search history.

(56) References Cited

U.S. PATENT DOCUMENTS

| | | | |
|---|---|---|---|
| 3,345,134 A | 10/1967 | Heymer et al. | |
| 4,534,100 A | 8/1985 | Lane | |
| 4,906,314 A | 3/1990 | Farnworth et al. | |
| 5,130,783 A | 7/1992 | McLellan | |
| 5,371,397 A | 12/1994 | Maegawa et al. | |
| 5,424,573 A | 6/1995 | Kato et al. | |
| 5,435,887 A | 7/1995 | Rothschild et al. | |
| 5,505,804 A * | 4/1996 | Mizuguchi et al. | 359/619 |
| 5,593,913 A | 1/1997 | Aoki | |
| 5,605,783 A * | 2/1997 | Revelli et al. | 430/321 |
| 5,672,519 A | 9/1997 | Song et al. | |
| 5,694,246 A | 12/1997 | Aoyama et al. | |
| 5,708,293 A | 1/1998 | Ochi et al. | |
| 5,771,158 A | 6/1998 | Yamagishi et al. | |
| 5,776,824 A | 7/1998 | Farnworth et al. | |
| 5,811,799 A | 9/1998 | Wu | |
| 5,821,532 A | 10/1998 | Beaman et al. | |
| 5,857,963 A | 1/1999 | Pelchy et al. | |
| 5,861,654 A | 1/1999 | Johnson | |

(Continued)

FOREIGN PATENT DOCUMENTS

EP     0 886 323     12/1998

(Continued)

OTHER PUBLICATIONS

U.S. Appl. No. 10/785,466, Kirby.

(Continued)

*Primary Examiner*—Alicia M Harrington
(74) *Attorney, Agent, or Firm*—Dickstein Shapiro LLP

(57) ABSTRACT

Microelectronic imagers, optical devices for microelectronic imagers, methods for manufacturing integrated optical devices for use with microelectronic imagers, and methods for packaging microelectronic imagers. The optical devices are manufactured in optical device assemblies that provide efficient and highly accurate fabrication of the optics that are used in microelectronic imagers. The optical device assemblies are particularly useful for packaging a plurality of microelectronic imagers at the wafer level. Wafer-level packaging is expected to significantly enhance the efficiency of manufacturing microelectronic imagers because a plurality of imagers can be packaged simultaneously using highly accurate and efficient processes developed for packaging processors, memory devices and other semiconductor devices.

37 Claims, 9 Drawing Sheets

U.S. PATENT DOCUMENTS

| | | | |
|---|---|---|---|
| 5,877,040 A | 3/1999 | Park et al. |
| 5,897,338 A | 4/1999 | Kaldenberg |
| 5,914,488 A | 6/1999 | Sone |
| 5,977,535 A | 11/1999 | Rostoker |
| 5,998,862 A | 12/1999 | Yamanaka |
| 6,080,291 A | 6/2000 | Woodruff et al. |
| 6,104,086 A | 8/2000 | Ichikawa et al. |
| 6,114,240 A | 9/2000 | Akram et al. |
| 6,143,588 A | 11/2000 | Glenn |
| 6,236,046 B1 | 5/2001 | Watabe et al. |
| 6,259,083 B1 | 7/2001 | Kimura |
| 6,266,197 B1 | 7/2001 | Glenn et al. |
| 6,274,927 B1 | 8/2001 | Glenn |
| 6,285,064 B1 | 9/2001 | Foster |
| 6,351,027 B1 | 2/2002 | Giboney et al. |
| 6,372,548 B2 | 4/2002 | Bessho et al. |
| 6,407,381 B1 | 6/2002 | Glenn et al. |
| 6,483,652 B2 | 11/2002 | Nakamura |
| 6,503,780 B1 | 1/2003 | Glenn et al. |
| 6,541,762 B2 | 4/2003 | Knag et al. |
| 6,560,047 B2 | 5/2003 | Choi et al. |
| 6,566,745 B1 | 5/2003 | Beyne et al. |
| 6,603,183 B1 | 8/2003 | Hoffman |
| 6,617,623 B2 | 9/2003 | Rhodes |
| 6,661,047 B2 | 12/2003 | Rhodes |
| 6,667,551 B2 | 12/2003 | Hanaoka et al. |
| 6,670,986 B1 | 12/2003 | Ben Shoshan et al. |
| 6,686,588 B1 | 2/2004 | Webster et al. |
| 6,703,310 B2 | 3/2004 | Mashino et al. |
| 6,864,172 B2 | 4/2004 | Noma et al. |
| 6,734,419 B1 | 5/2004 | Glenn et al. |
| 6,759,266 B1 | 7/2004 | Hoffman |
| 6,774,486 B2 | 8/2004 | Kinsman |
| 6,778,046 B2 | 8/2004 | Stafford et al. |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,813,154 B2 | 11/2004 | Diaz et al. |
| 6,825,458 B1 | 11/2004 | Moess et al. |
| 6,828,663 B2 | 12/2004 | Chen et al. |
| 6,828,674 B2 | 12/2004 | Karpman |
| 6,844,978 B2 * | 1/2005 | Harden et al. | 359/619 |
| 6,882,021 B2 | 4/2005 | Boon et al. |
| 6,885,107 B2 | 4/2005 | Kinsman |
| 6,934,065 B2 | 8/2005 | Kinsman |
| 6,946,325 B2 | 9/2005 | Yean et al. |
| 2002/0006687 A1 | 1/2002 | Lam |
| 2002/0057468 A1 | 5/2002 | Segawa et al. |
| 2002/0089025 A1 | 7/2002 | Chou |
| 2002/0096729 A1 | 7/2002 | Tu et al. |
| 2002/0113296 A1 | 8/2002 | Cho et al. |
| 2002/0145676 A1 | 10/2002 | Kuno et al. |
| 2003/0062601 A1 | 4/2003 | Harnden et al. |
| 2004/0012698 A1 * | 1/2004 | Suda et al. | 348/315 |
| 2004/0023469 A1 * | 2/2004 | Suda | 438/458 |
| 2004/0038442 A1 | 2/2004 | Kinsman |
| 2004/0041261 A1 | 3/2004 | Kinsman |
| 2004/0082094 A1 * | 4/2004 | Yamamoto | 438/65 |
| 2004/0214373 A1 | 10/2004 | Jiang et al. |
| 2004/0245649 A1 | 12/2004 | Imaoka |
| 2005/0052751 A1 * | 3/2005 | Liu et al. | 359/626 |
| 2005/0104228 A1 | 5/2005 | Rigg et al. |
| 2005/0110889 A1 | 5/2005 | Tuttle et al. |
| 2005/0127478 A1 | 6/2005 | Hiatt et al. |
| 2005/0151228 A1 | 7/2005 | Tanida et al. |
| 2005/0184219 A1 * | 8/2005 | Kirby | 250/208.1 |
| 2005/0236708 A1 | 10/2005 | Farnworth et al. |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.
Brubaker, C. et al., "Ultra-thick Lithography for Advanced Packaging and MEMS," SPIE's 27th Annual International Symposium on Microlithography 2002, Mar. 3-8, 2002, Santa Clara, CA.
Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

US 7,253,957 B2

INTEGRATED OPTICS UNITS AND METHODS OF MANUFACTURING INTEGRATED OPTICS UNITS FOR USE WITH MICROELECTRONIC IMAGERS

TECHNICAL FIELD

The following disclosure relates generally to microelectronic devices and methods for packaging microelectronic devices. Several aspects of the present invention are directed toward packaging microelectronic imagers that are responsive to radiation in the visible light spectrum or radiation in other spectrums.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also quickly becoming very popular because they are expected to have low production costs, high yields and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer substrate 20 attached to the die 10, and a housing 30 attached to the interposer substrate 20. The housing 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer substrate 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer substrate 20 by wire-bonds 28 to provide electrical pathways between the bond-pads 14 and the ball-pads 24.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with packaging conventional microelectronic imagers is that it is difficult to accurately align the lens with the image sensor. Referring to FIG. 1, the centerline of the lens 70 should be aligned with the centerline of the image sensor 12 within very tight tolerances. For example, as microelectronic imagers have higher pixel counts and smaller sizes, the centerline of the lens 70 is often required to be within a few microns of the centerline of the image sensor 12. This is difficult to achieve with conventional imagers because the support 50 may not be positioned accurately on the housing 30, and the barrel 60 is manually threaded onto the support 50. Therefore, there is a need to align lenses with image sensors with greater precision in more sophisticated generations of microelectronic imagers.

Another problem of packaging conventional microelectronic imagers is that positioning the lens at a desired focus distance from the image sensor is time-consuming and may be inaccurate. The lens 70 shown in FIG. 1 is spaced apart from the image sensor 12 at a desired distance by rotating the barrel 60 (arrow R) to adjust the elevation (arrow E) of the lens 70 relative to the image sensor 12. In practice, an operator rotates the barrel 60 by hand while watching an output of the imager 1 on a display until the picture is focused based on the operator's subjective evaluation. The operator then adheres the barrel 60 to the support 50 to secure the lens 70 in a position where it is spaced apart from the image sensor 12 by a suitable focus distance. This process is problematic because it is exceptionally time-consuming and subject to operator errors.

Yet another concern of conventional microelectronic imagers is that they have relatively large footprints and occupy a significant amount of vertical space (i.e., high profiles). The footprint of the imager in FIG. 1 is the surface area of the bottom of the interposer substrate 20. This is typically much larger than the surface area of the die 10 and can be a limiting factor in the design and marketability of picture cell phones or PDAs because these devices are continually shrinking to be more portable. Therefore, there is a need to provide microelectronic imagers with smaller footprints and lower profiles.

Yet another concern of conventional microelectronic imagers is the manufacturing costs for packaging the dies. The imager 1 shown in FIG. 1 is relatively expensive because manually adjusting the lens 70 relative to the image sensor 12 is very inefficient and subject to error. Moreover, the support 50 and barrel 60 are assembled separately for each die 10 individually after the dies have been singulated from a wafer and attached to the interposer substrate 20. Therefore, there is a significant need to enhance the efficiency, reliability and precision of packaging microelectronic imagers.

DETAILED DESCRIPTION

A. Overview

Figure 1:
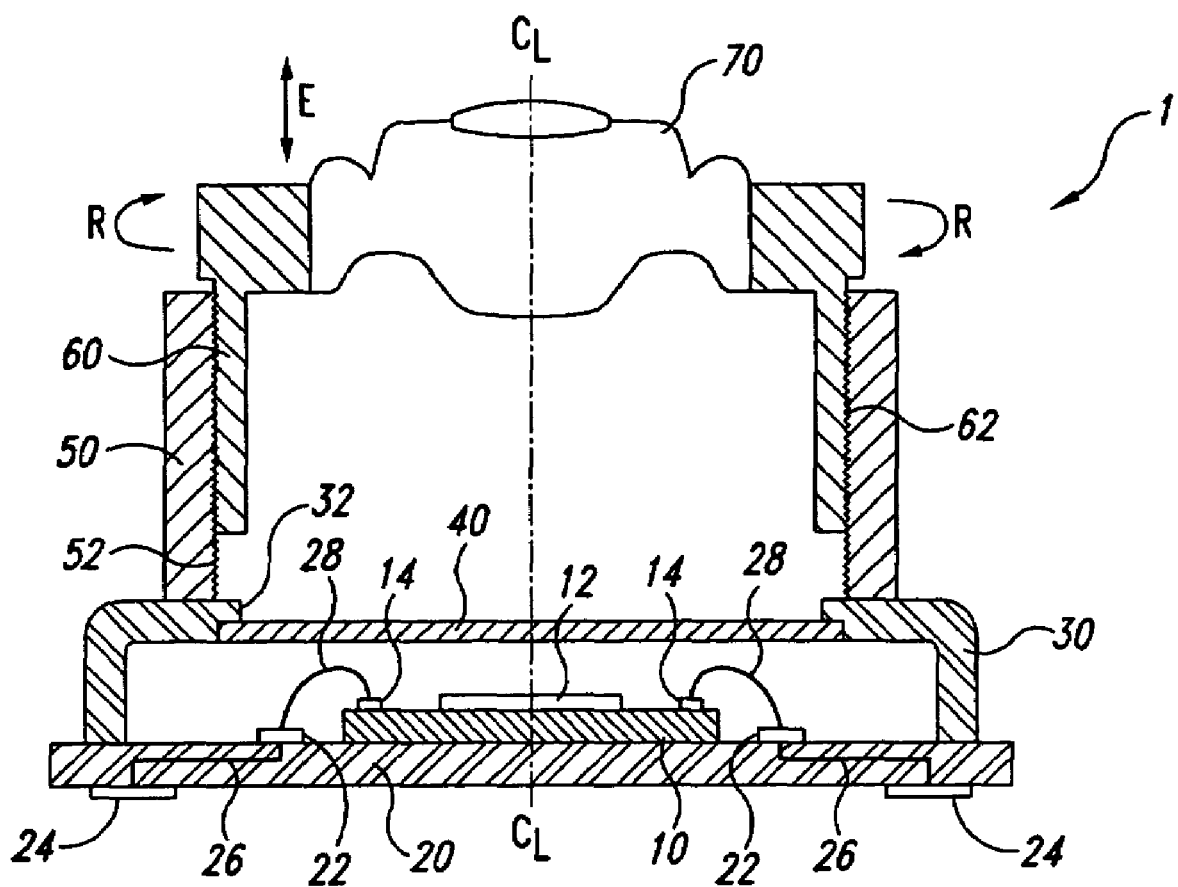
FIG. 1 is a cross-sectional view of a packaged microelectronic imager in accordance with the prior art.

The following disclosure describes several embodiments of microelectronic imagers, optical devices for microelectronic imagers, methods for manufacturing integrated optical devices for use with microelectronic imagers, and methods for packaging microelectronic imagers. The optical devices are manufactured together on an optical device assembly that provides efficient and highly accurate fabrication of the optics that are used in microelectronic imagers. Such optical device assemblies are particularly useful for wafer-level packaging of a plurality of microelectronic imagers. Wafer-level packaging is expected to significantly enhance the efficiency of manufacturing microelectronic imagers because a plurality of imagers can be packaged simultaneously using highly accurate and efficient processes developed for packaging processors, memory devices and other semiconductor devices. Moreover, wafer-level packaging is also expected to enhance the quality and performance of microelectronic imagers because the semiconductor fabrication processes can reliably align an optical device with an image sensor and space the optical device apart from the image sensor by a desired distance with a high degree of precision. Several embodiments of microelectronic imagers and methods for packaging microelectronic imagers in accordance with the invention are thus expected to significantly reduce the costs for assembling microelectronic imagers, increase the performance of microelectronic imagers, and produce smaller imagers compared to conventional devices.

An aspect of the invention is directed toward methods for fabricating a plurality of optical devices for use in microelectronic imagers. One embodiment of such a method comprises providing a substrate having a plurality of discrete device sites and producing a plurality of optics elements located at the device sites. The substrate is transmissive to a desired radiation, such as light in the visible spectrum, ultraviolet light, infrared radiation and/or other spectrums. The substrate can be glass, quartz, plastics or other materials suitable for a particular application. The optics elements are configured to manipulate the radiation passing through the optical devices. The optics elements, for example, can include lenses that direct the radiation (e.g., members having curved surfaces and/or pin-holes), filters and/or other optics. The optics elements and the substrate together define an optical device assembly having a plurality of discrete optical devices.

Another embodiment of a method for fabricating a plurality of optical devices in accordance with the invention comprises providing a substrate that is transmissive to a desired radiation. The substrate has a first device site for a first optical device and a second device site for a second optical device. The first and second optical device sites are separated by a cutting line for subsequently separating the first optical device from the second optical device. This embodiment also includes producing first and second lenses. The first lens is located at the first device site to define the first optical device, and the second lens is located at the second device site to define the second optical device.

Still another embodiment of a method for fabricating optical devices in accordance with the invention includes providing a substrate transmissive to the desired radiation and producing a plurality of optics elements simultaneously at different device sites of the substrate. The optics elements are produced simultaneously using injection molding process, etching procedures or other suitable techniques. As such, this method involves concurrently forming a plurality of optical devices on the substrate.

Another aspect of the present invention is directed towards optical device assemblies having a plurality of individual optical devices. One embodiment of an optical device assembly in accordance with the invention comprises a substrate transmissive to a desired radiation. The substrate has a plurality of discrete device sites. The optical device assembly of this embodiment further includes a plurality of optics elements that are configured to direct radiation passing through the optics elements for use with microelectronic imagers. The optics elements are located at corresponding device sites of the substrate to form individual optical devices.

Another embodiment of an optical device assembly in accordance with the invention comprises a plurality of discrete optical devices on a single substrate that is transmissive to a desired radiation. Each optical device includes an optics element configured to direct radiation passing through the optical device. The optics elements are separated from each other on the substrate by cutting lanes for subsequently cutting the substrate to separate individual optical devices from each other.

Still another embodiment of an optical device assembly in accordance with the invention comprises a substrate transmissive to a desired radiation. The substrate has a first device site and a second device site. The optical device assembly further includes a first optics element at the first device site to form a first optical device and a second optics element at the second device site to form a second optical device. The first and second optics elements are separated by a cutting line to subsequently separate the first optical device from the second optical device.

Specific details of several embodiments of the invention are described below with reference to CMOS imagers to provide a thorough understanding of these embodiments, but other embodiments can be CCD imagers or other types of imagers. Several details describing well-known structures often associated with microelectronic devices are not set forth in the following description to avoid unnecessarily obscuring the description of the disclosed embodiments. Additionally, several other embodiments of the invention can have different configurations or components than those described in this section. As such, a person of ordinary skill in the art will accordingly understand that the invention may have other embodiments with additional elements or without several of the elements shown and described below with reference to FIGS. 2A-12.

Wafer-Level Packaging of Microelectronic Imagers

Figure 2A:
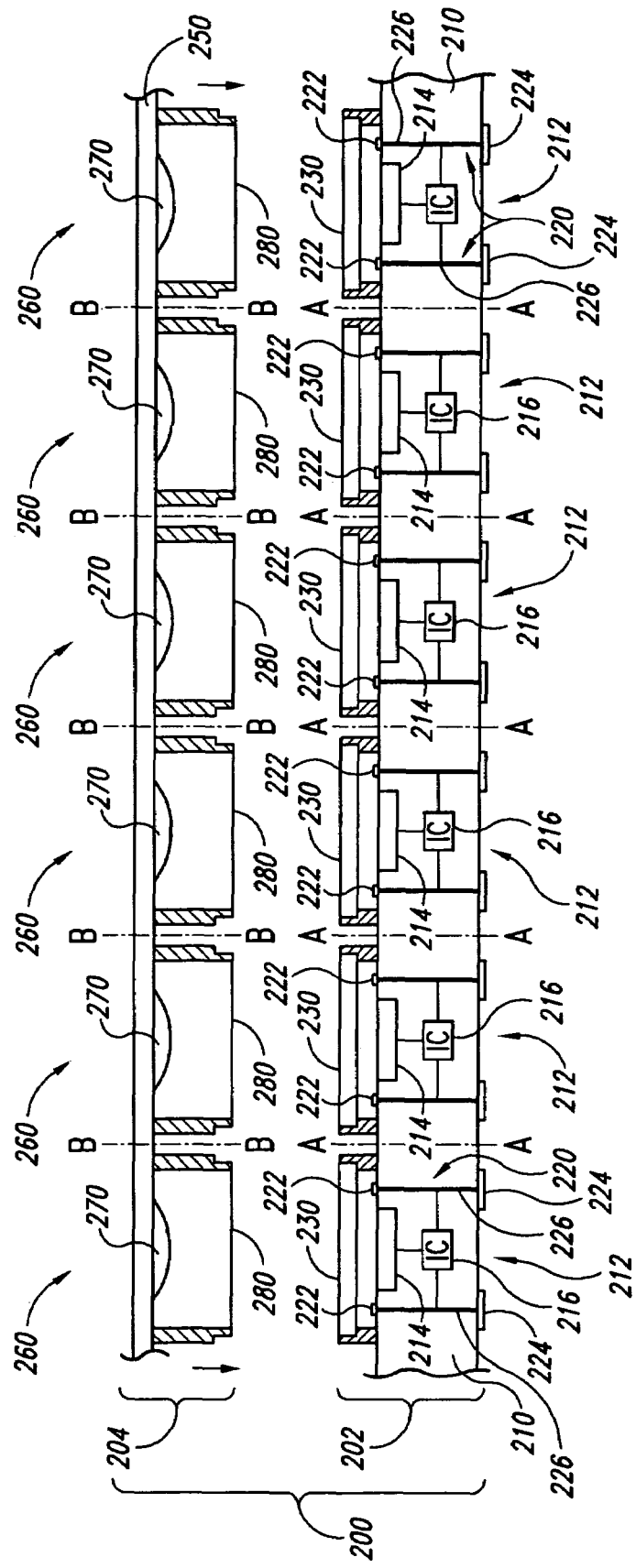
FIG. 2A is a side cross-sectional view of an imager workpiece having a plurality of imaging units and an optical device assembly having a plurality of optical devices in accordance with an embodiment of the invention at one stage of packaging microelectronic imagers at the wafer level.

FIG. 2A is a side cross-sectional view showing a portion of a Wafer-level assembly 200 including an imager workpiece 202 and an optical device assembly 204 aligned with each other for wafer-level packaging of microelectronic imagers. The imager workpiece 202 has a first substrate 210 and a plurality of imaging units 212 formed on the first substrate 210. Individual imaging units 212 can include an image sensor 214, integrated circuitry (IC) 216 coupled to the image sensor 214, and external contacts 220 electrically coupled to the integrated circuitry 216. The image sensor 214 can be a CMOS device or a CCD for capturing pictures or other images in the visible spectrum, but the image sensor 214 can detect radiation in other spectrums (e.g., IR or UV ranges). The embodiment of the external contacts 220 shown in FIG. 2A provides a small array of ball-pads within the footprint of the die. Each external contact 220, for example, can include a bond-pad 222, a ball-pad 224, and a through-wafer interconnect 226 coupling the bond-pad 222 to the ball-pad 224. The through-wafer interconnects 226 can be formed according to the processes disclosed in U.S. patent application Ser. No. 10/713,878, entitled "Methods for Forming Vias in Microelectronic Devices, and Methods for Packaging Microelectronic Devices," filed on Nov. 13, 2003, which is incorporated by reference herein. Other embodiments of external contacts can include contacts having traces that wrap around the side of the substrate 210.

The imaging units 212 can also include first referencing elements 230. The first reference elements 230 can be components of stand-offs for attaching the optical device assembly 204 to the imager workpiece 202. The first referencing elements 230 can be similar to the first referencing elements shown and described in U.S. patent application Ser. No. 10/723,363, entitled "Packaged Microelectronic Imagers and Methods of Packaging Microelectronic Imagers," filed on Nov. 26, 2003, which is incorporated by reference herein.

The optical device assembly 204 includes a second substrate 250 and a plurality of optical devices 260 on the second substrate 250. Individual optical devices 260 can include an optics element 270 and a second referencing element 280. The first and second referencing elements 230 and 280 are configured to be keyed together or otherwise seat with each other in a manner that aligns individual optics elements 270 with corresponding image sensors 214. The first and second referencing elements 230 and 280 are also configured to space the individual optics elements 270 apart from corresponding image sensors 214 by a desired distance. The second referencing elements 280 can be similar to the second referencing elements shown U.S. patent application Ser. No. 10/723,363 incorporated by reference above. The stand-offs between the optical devices 260 and the imaging units 212, however, do not need to have separate referencing elements as shown in FIG. 2A. The stand-offs can accordingly be single components constructed on just one of the first or second substrates 210 or 250.

Figure 2B:
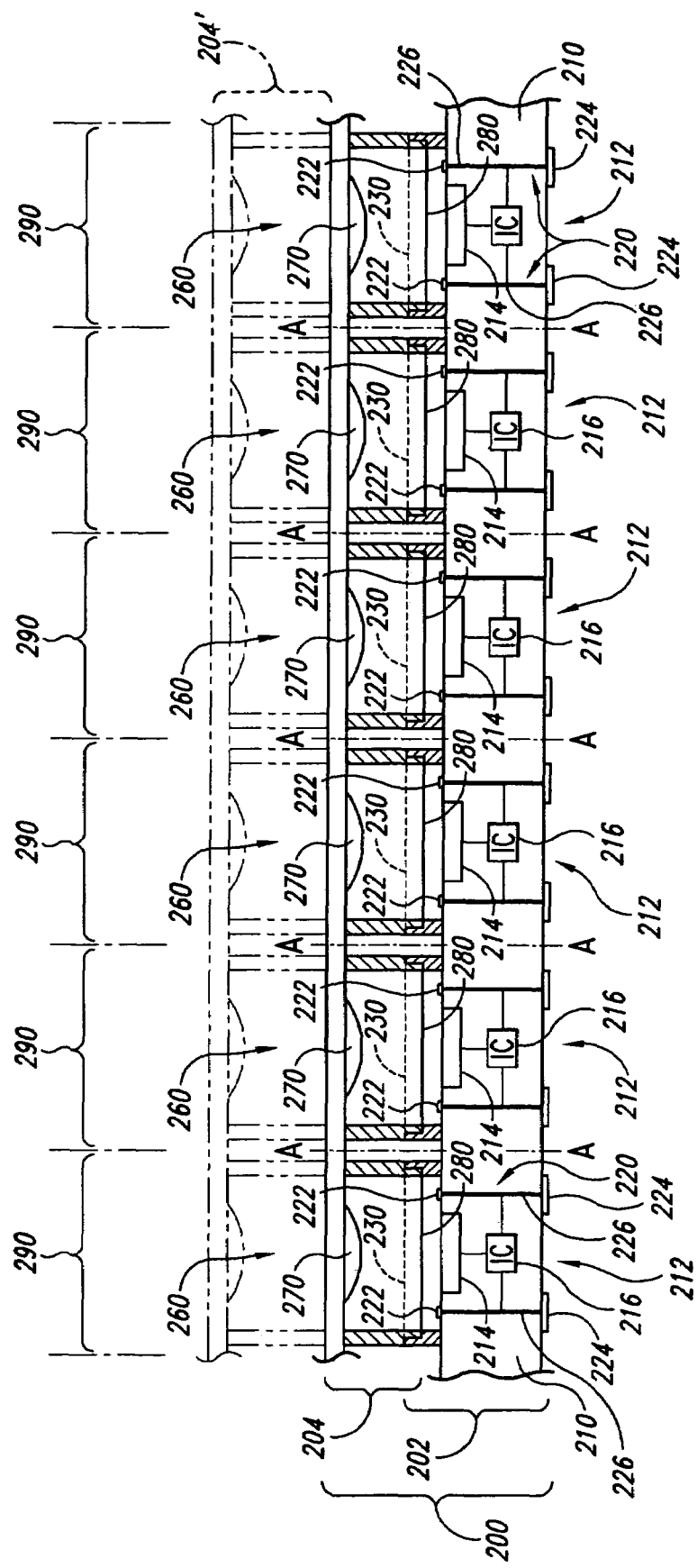
FIG. 2B is a side cross-sectional view of a plurality of assembled microelectronic imagers including the imager workpiece and the optical device assembly of FIG. 2A in accordance with an embodiment of the invention.

FIG. 2B is a schematic cross-sectional view illustrating a plurality of microelectronic imagers 290 that have been packaged at the wafer level. The imagers 290 can be assembled by seating individual first referencing elements 230 with corresponding second referencing elements 280. In one embodiment, the first and second referencing elements 230/280 are seated together before cutting the first substrate 210 or the second substrate 250 such that all of the microelectronic imagers 290 are assembled at the wafer level. Both of the first and second substrates 210 and 250 can then be cut along lines A-A to separate individual imagers 290 from each other. In a different embodiment, the individual microelectronic imagers are formed by cutting the second substrate 250 along lines B-B (FIG. 2A) to singulate the individual optics units 260, attaching the individual optics units 260 to corresponding imaging units 212 before cutting the first substrate 210, and then cutting the first substrate 210 along lines A-A to singulate individual imagers. In still another embodiment, the first substrate 210 can be cut along lines A-A (FIG. 2A) to singulate the imaging units 212, and only the known good imaging units 212 are then mounted to corresponding optics units 260 either before or after singulating the second substrate 250 along lines B-B (FIG. 2B).

In an alternative embodiment, the wafer-level assembly 200 can further include a second optical device assembly 204' (shown in phantom) on top of the optical device assembly 204. The second optical device assembly 204' can be similar to the first optical device assembly, or it can have different lenses, height, etc. Additionally, still other embodiments of wafer-level assemblies can have more than two optical device assemblies stacked on each other such that three or more levels of focusing lenses, dispersion lenses, pin-hole lenses, filters, anti-reflective members or other types of optics can be above the image sensors.

The wafer-level packaging of the microelectronic imagers 290 shown in FIG. 2B is enabled, at least in part, by forming an optical device assembly with a plurality of individual optical devices arranged in a pattern corresponding to the arrangement of imaging units 212 on the imaging workpiece 202. Several embodiments of optical device assemblies and methods for manufacturing such optical device assemblies are described below.

C. Optical Device Assemblies for Microelectronic Imagers

FIGS. 3A-12 illustrate several different optical device assemblies and methods for fabricating a plurality of optical devices on a substrate in accordance with embodiments of the invention. The optical device assemblies shown in FIGS. 3A-12 can all be used to package microelectronic imagers at the wafer level as described above with reference to FIGS. 2A-B. Therefore, additional embodiments of the invention are directed to packaging microelectronic imagers at the wafer level using any of the optical device assemblies illustrated in FIGS. 3A-12 and/or other optical devices having any combination of the features shown in these Figures.

Figure 3A:
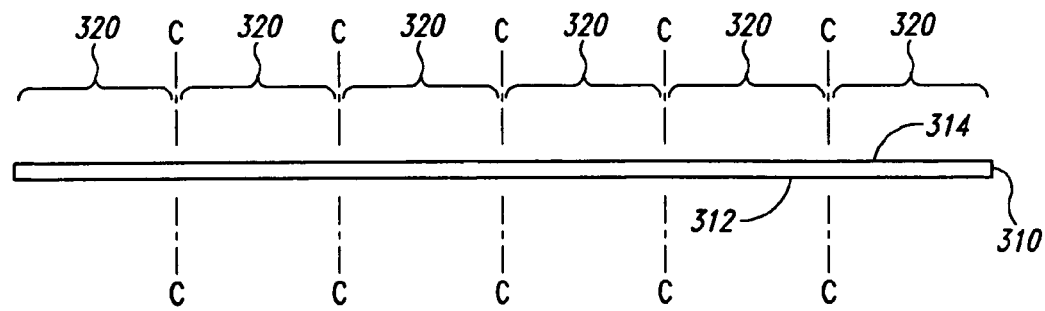
FIGS. 3A and 3B are schematic cross-sectional views illustrating one method for manufacturing an optical device assembly in accordance with an embodiment of the invention.
Figure 3B:
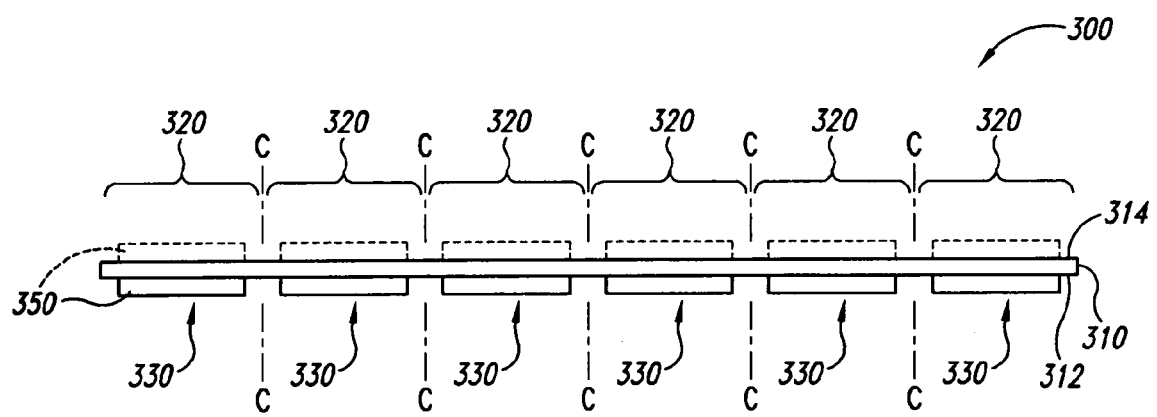

FIGS. 3A and 3B are schematic cross-sectional views illustrating a method for manufacturing an optical device assembly 300 (FIG. 3B) in accordance with an embodiment of the invention. The optical device assembly 300 includes a substrate 310 having a first side 312 and a second side 314. The substrate 310 further includes a plurality of discrete device sites 320 at which individual optical devices 330 (FIG. 3B) are constructed on and/or in the substrate 310. The boundaries of the device sites 320 can be defined by cutting lanes C-C along which the substrate 310 can be cut to singulate individual optical devices from each other.

The substrate 310 is transmissive to a desired radiation. When the imagers are for use in cameras, for example, the substrate is transmissive to light in the visible spectrum. The substrate 310, however, can be transmissive to ultraviolet light, infrared radiation and/or any other suitable spectrum according to the particular application of the imager. The substrate 310 can be composed of glass, quartz, plastics and/or other materials. The substrate 310 can also be configured to be handled by semiconductor fabrication equipment. As such, the substrate 310 can be a thin wafer having a thickness of approximately 150-1,500 μm and a diameter of approximately 200-300 mm, or it can have other dimensions suitable for being handled by automatic fabrication equipment.

Referring to FIG. 3B, the method continues by producing a plurality of optics elements 350 on the substrate 310. The optical device assembly 300 typically has an optics element 350 at each of the device sites 320. The optics elements 350 can be on the first side 312 and/or the second side 314 of the substrate 310. For example, the optics elements 350 can include a first optic member (shown in solid lining) on the first side 312 of the substrate 310 at the device sites 320. In other embodiments, the optics elements 350 can include a second optic member (shown in broken lining) on the second side 314 of the substrate 310 in addition to or in lieu of the first optic member.

The optics elements 350 are configured to manipulate the radiation for use by the image sensors 214 (FIG. 2B). For example, the optics elements 350 can be lenses that direct the radiation 350 for focusing, dispersing and/or removing higher order defractions from the radiation. Such optics elements 350 can be lenses having a curvature and/or a pin-hole aperture. As explained in more detail below, the optics elements 350 can be produced by molding a compound onto the substrate 310 or separately from the substrate 310, etching the substrate 310 or a layer of material on the substrate 310, and/or attaching individual optics elements to the substrate 310.

Figure 4:
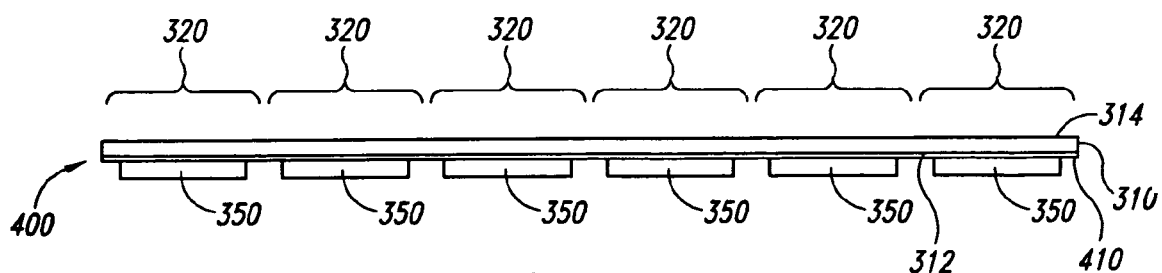
FIG. 4 is a schematic cross-sectional view illustrating an optical device assembly in accordance with another embodiment of the invention.

FIG. 4 is a schematic cross-sectional view illustrating an optical device assembly 400 in accordance with another embodiment of the invention. The optical device assembly 400 is similar to the optical device 300, and thus like reference numbers refer to like components in these figures. The optical device assembly 400 is different than the optical device assembly 300 in that the optical device assembly 400 includes a filter 410 on the substrate 310. The filter 410 can be a thin film or film stack having a plurality of films deposited onto the first or second sides 312/314 of the substrate 310. The filter 410, for example, can be an IR filter to prevent infrared radiation from passing through the optics elements 350. The filter 410 can have several other embodiments for filtering other spectrums in addition to or in lieu of infrared radiation. In other embodiments, the filter 410 can be formed on the optics elements 350 instead of the substrate 310. The filter 410 can accordingly be a layer of material that is "over" the substrate 310 in the sense that it can be directly on the substrate 310 or on a component attached to the substrate 310.

Figure 5:
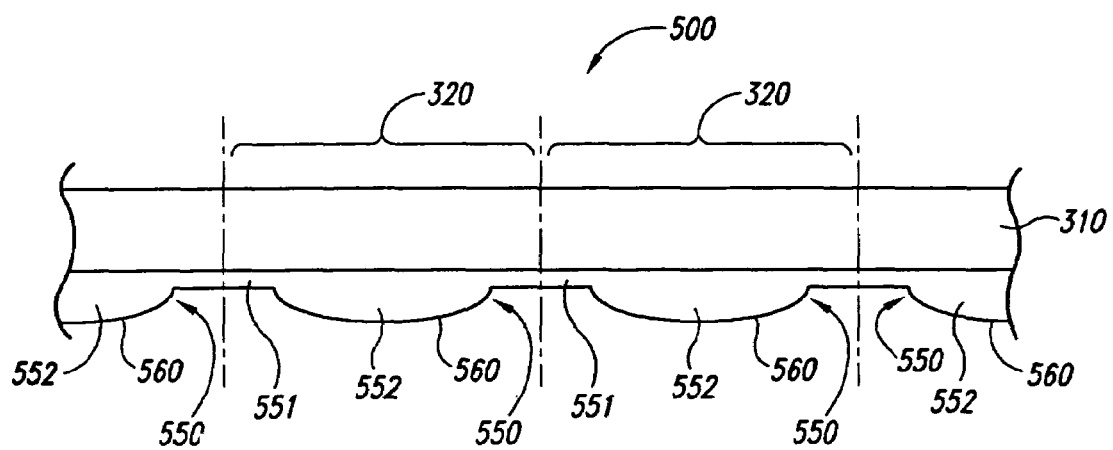
FIG. 5 is a schematic cross-sectional view illustrating an optical device assembly in accordance with another embodiment of the invention.

FIG. 5 is a schematic cross-sectional view illustrating an optical device assembly 500 in accordance with another embodiment of the invention. Like reference numbers refer to like components in FIGS. 3B and 5. The optical device assembly 500 has a plurality of optics elements 550, and each optics element 550 is located at a device site 320. The optics elements 550 shown in FIG. 5 are formed with a common base 551, and each optics element 550 has a lens 552 including a curved surface 560 for directing the radiation as it passes through the optics elements 550. The curved surfaces 560, which are shown schematically in FIG. 5, can have any combination of convex and/or concave curvatures with respect to the substrate 310 to provide the desired optics.

The optics elements 550 shown in FIG. 5 are formed by molding a compound to form the base 551 and individual lenses 552. For example, the optics elements 550 can be formed in an injection molding process in which the base 551 is molded onto the substrate 310 and the lenses 552 are molded integrally with the base 551. Alternatively, the optics elements 550 can be molded separately from the substrate 310 as a single unit, and then the base 551 is attached to the substrate 310 with an adhesive. The optics elements 550 are accordingly made from a suitable compound such as glass, quartz, plastics and/or other materials that can be molded into the desired shape and provide the desired transmission properties for the radiation.

Several embodiments of the optical device assemblies shown in FIGS. 2A-5 can be used to enable wafer-level packaging processes for imagers in a manner that is expected to significantly improve the quality of the imagers. Compared to conventional processes for assembling microelectronic imagers by hand, the optical device assemblies described above enhance (a) the ability to produce very small optics elements within demanding tolerances, (b) the accuracy with which the optics elements are aligned with corresponding image sensors, and/or (c) the accuracy with which the optics elements are spaced apart from the image sensors by a desired distance. One aspect of the optical devices is that they are fabricated on a wafer and then assembled with imaging units using semiconductor processing technologies. This provides very precise tolerances for the optics elements, and it also enables highly accurate positioning/placement of the optical devices relative to the image sensors. Thus, the embodiments of the optical device assemblies in FIGS. 2A-5 can enable smaller and/or higher performance packages because they can be formed and assembled with a high degree of precision.

Several embodiments of these optical device assemblies are further expected to be a factor in wafer-level packaging processes that improve the efficiency of packaging imagers compared to the manual process of packaging the conventional imager shown in FIG. 1. First, a plurality of imaging units and optics elements can be fabricated simultaneously at the wafer level using semiconductor fabrication techniques. Second, a plurality of the optical devices can be attached to a corresponding plurality of the imaging units at the wafer level using automated equipment. This accordingly eliminates manually positioning individual lenses with respect to the imaging sensor, which should significantly enhance the throughput and yield of packaging microelectronic imagers.

Figure 6:
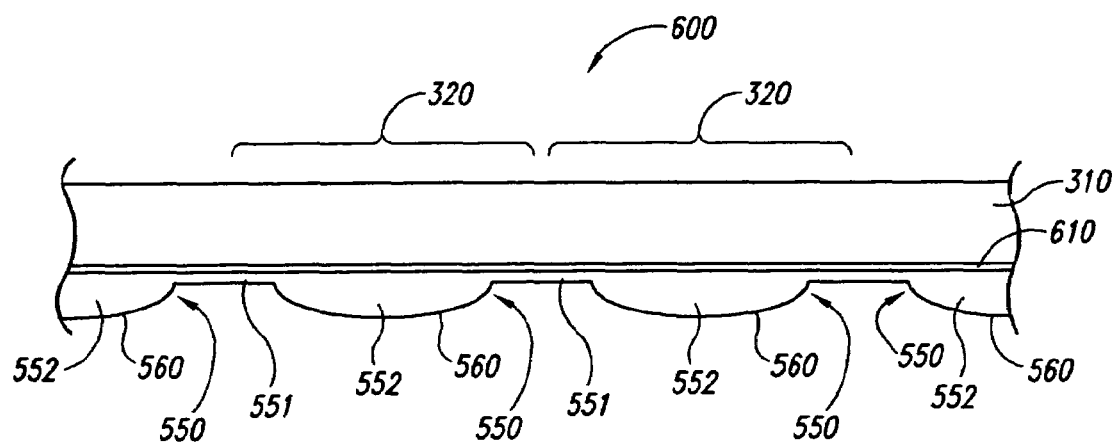
FIG. 6 is a schematic cross-sectional view illustrating an optical device assembly in accordance with another embodiment of the invention.

FIG. 6 is a schematic cross-sectional view illustrating an optical device assembly 600 in accordance with another embodiment of the invention. The optical device assembly 600 is substantially similar to the optical device assembly 500 shown in FIG. 5, but the optical device assembly 600 includes a filter 610 between the substrate 310 and the optics elements 550. As explained above, the filter 610 can be on the other side of the substrate 310 or on the exterior surfaces of the optics elements 550. The filter 610 removes undesirable radiation from passing through the optical devices.

Figure 7A:
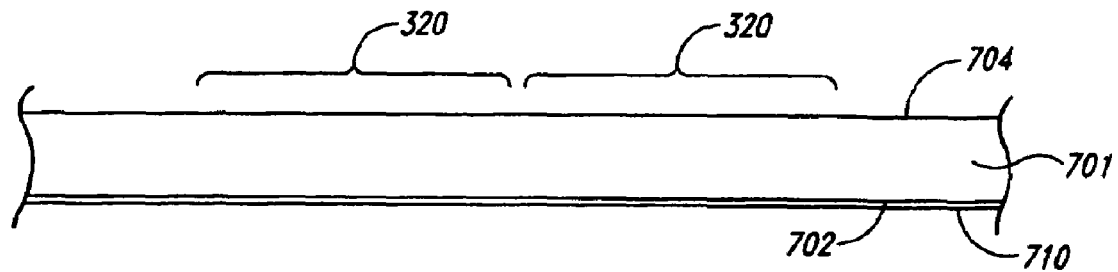
FIGS. 7A and 7B are schematic cross-sectional views illustrating a method for manufacturing an optical device assembly in accordance with another embodiment of the invention.
Figure 7B:
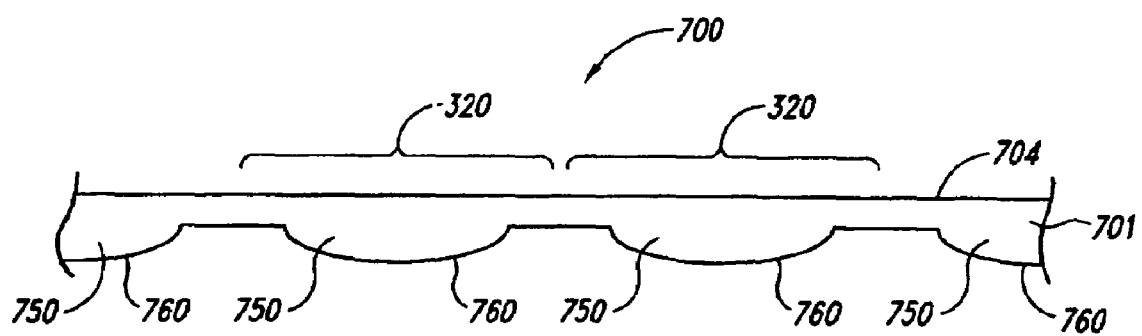

FIGS. 7A and 7B are schematic cross-sectional views illustrating a method for manufacturing an optical device assembly 700 (FIG. 7B) in accordance with another embodiment of the invention. Referring to FIG. 7A, this method includes providing a substrate 701 having a first side 702, a second side 704, and a plurality of the device sites 320. The substrate 701 shown in FIG. 7A is substantially similar to the substrate 310 shown in FIG. 3A, but the substrate 701 is patterned with a hard mask 710 (shown schematically without a pattern of apertures) to form the optics elements by etching the substrate 701. The mask 710 can be a layer of resist or other material that is patterned as known in the art of semiconductor manufacturing.

Figure 9A:
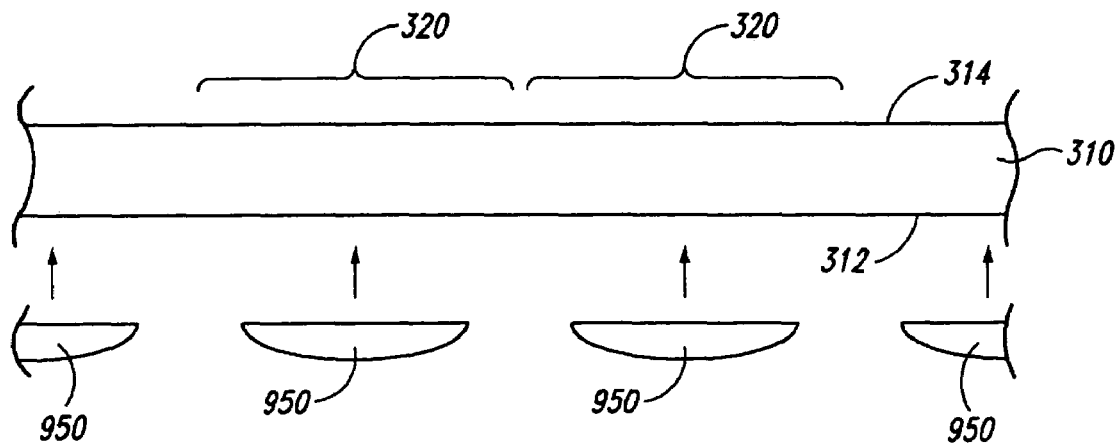
FIGS. 9A and 9B are schematic cross-sectional views illustrating a method for manufacturing an optical device assembly in accordance with another embodiment of the invention.
Figure 9B:
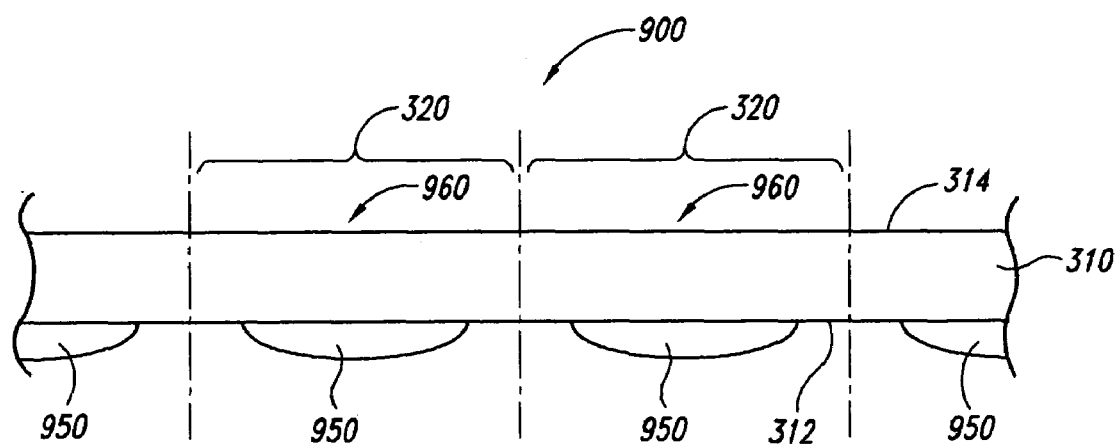

FIGS. 9A and 9B are schematic cross-sectional views illustrating another method for manufacturing a device assembly 900 (FIG. 9B) in accordance with an embodiment of the invention. The optical device assembly 900 includes the substrate 310 described above and a plurality of separate optics elements 950. The optics elements 950 are produced by molding and/or etching lenses separately from the substrate 310 and then attaching the lenses to the substrate 310. In one embodiment, the optics elements 950 are etched from a substrate made from the same material or a different material than that of the substrate 310. Alternatively, the optics elements 950 are molded either as a single unit that is subsequently cut or as individual pieces. Referring to FIG. 9B, the optics elements 950 are attached to the substrate 310 at the device sites 320 to form a plurality of optical devices 960 on the optical device assembly 900.

Figure 8A:
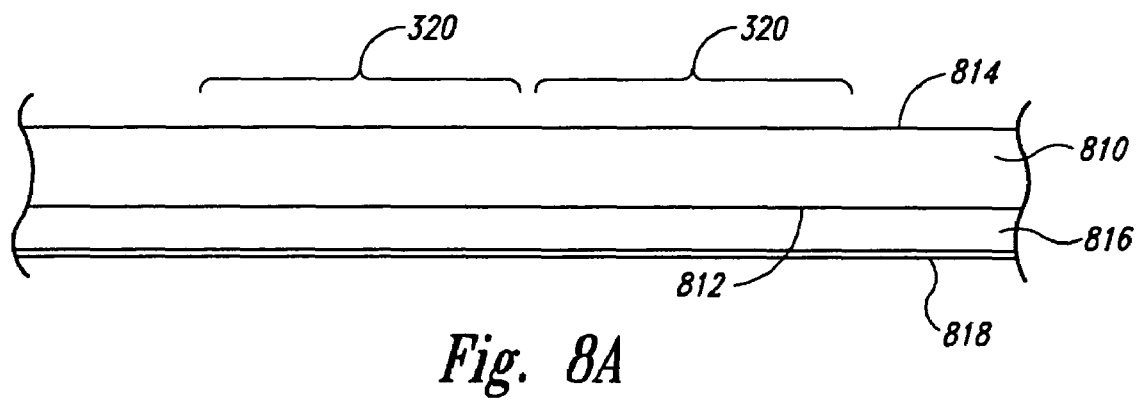
FIGS. 8A and 8B are schematic cross-sectional views illustrating a method for manufacturing an optical device assembly in accordance with another embodiment of the invention.
Figure 8B:
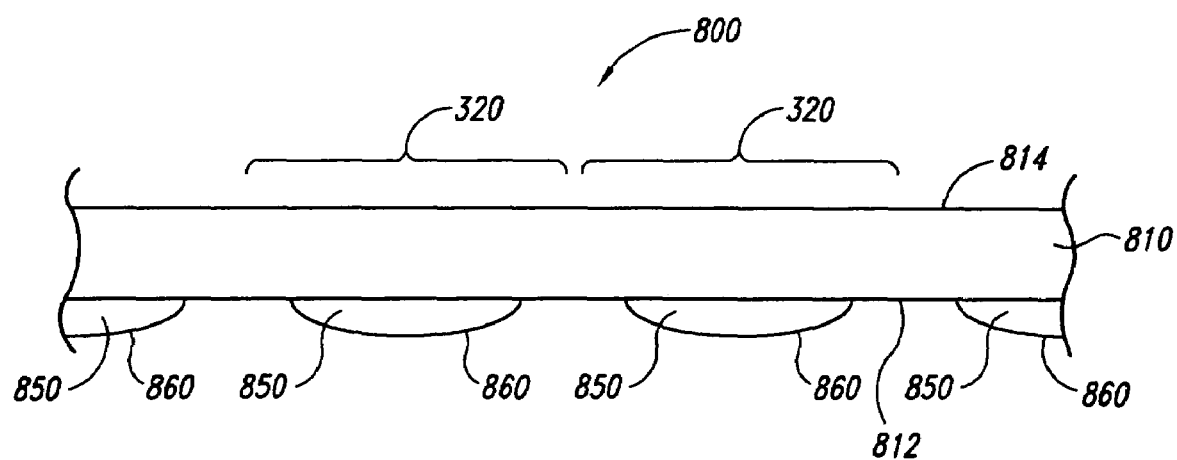

FIGS. 8A and 8B are schematic cross-sectional views of a method for manufacturing an optical device assembly 800 (FIG. 8B) in accordance with another embodiment of the invention. The optical device assembly 800 is fabricated using an etching process that is similar to the process described above with reference to FIGS. 7A-B. Referring to FIG. 8A, the optical device assembly 800 is constructed by providing a substrate 810 having a first side 812 and a second side 814. This method continues by depositing a layer of lens material 816 onto the substrate 810 and patterning the layer of lens material 816 with a mask 818 (shown schematically without apertures). Referring to FIG. 8B, the layer of lens material 816 is etched using one or more mask/etch steps to form a plurality of optics elements 850 on the substrate 810. The optics elements 850 are located at corresponding device sites 320, and the optics elements 850 have a desired surface 860 for manipulating the radiation as it passes through the optics elements 850. The optics elements 850 can be different from the optics elements 750 shown in FIG. 7B in that the optics elements 850 can be composed of a different material than a substrate 810. For example, the substrate 810 can be a quartz plate and the optics elements 850 can be plastic or another material having the desired configuration and transmissiveness to manipulate the radiation accordingly.

FIGS. 9A and 9B are schematic cross-sectional views illustrating another method for manufacturing a device assembly 900 (FIG. 9B) in accordance with an embodiment of the invention. The optical device assembly 900 includes the substrate 310 described above and a plurality of separate optics elements 950. The optics elements 950 are produced by molding and/or etching lenses separately from the substrate 310 and then attaching the lenses to the substrate. In one embodiment, the optics elements 950 are etched from a substrate made from the same material or a different material than that of the substrate 310. Alternatively, the optics elements 950 are molded either as a single unit that is subsequently cut or as individual pieces. Referring to FIG. 9B, the optics elements 950 are attached to the substrate 310 at the device sites 320 to form a plurality of optical devices 960 on the optical device assembly 900.

Figure 10:
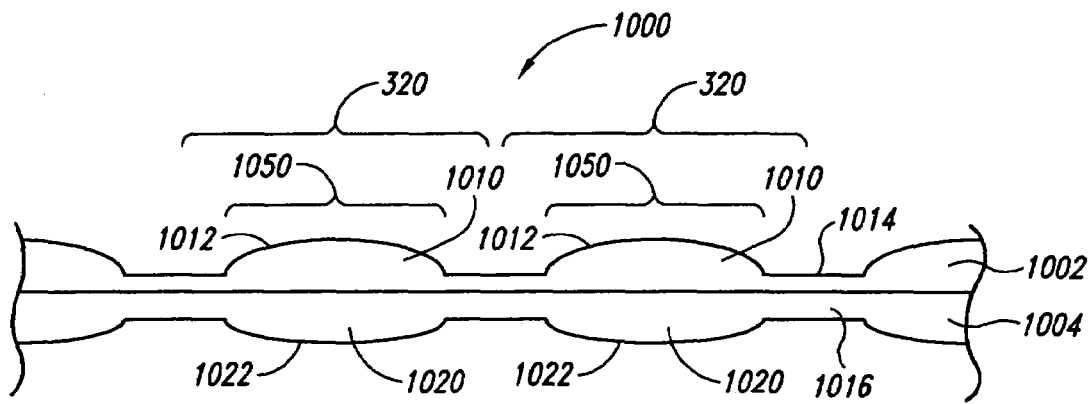
FIG. 10 is a schematic cross-sectional view illustrating an optical device assembly in accordance with another embodiment of the invention.
Figure 11:
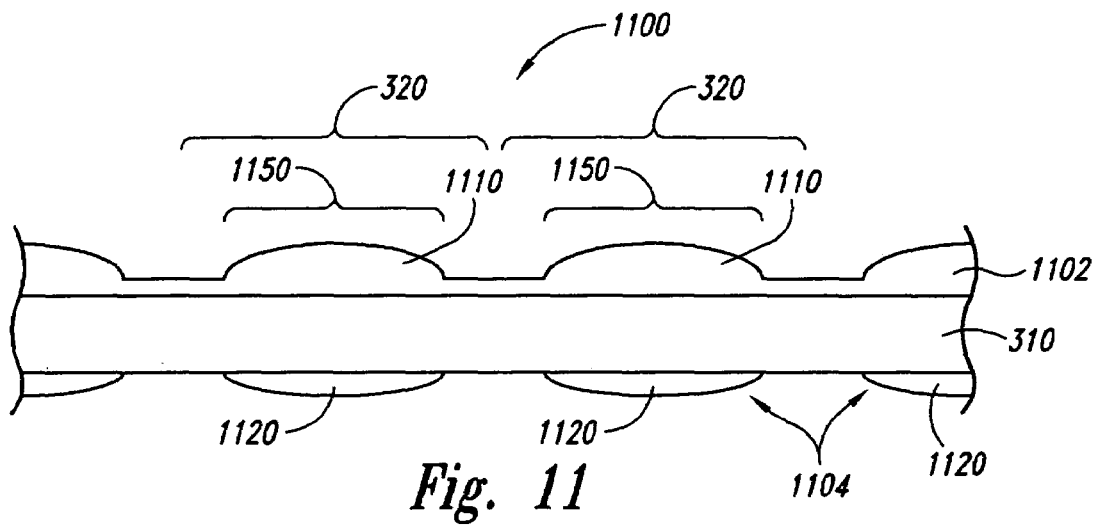
FIG. 11 is a schematic cross-sectional view illustrating an optical device assembly in accordance with another embodiment of the invention.

The various features illustrated in the optical device assemblies shown in FIGS. 3A-9B can be combined to form other optical device assemblies. FIGS. 10 and 11, for example, are schematic cross-sectional views illustrating optical device assemblies 1000 and 1100 in accordance with additional embodiments of the invention. The optical device assembly 1000 shown in FIG. 10 can have a first section 1002 and a second section 1004. The first section 1002 can include a plurality of first optic members 1010 having first curved surfaces 1012, and the second section 1004 can have a plurality of second optic members 1020 having second curved surfaces 1022. The first and second curved surfaces 1012 and 1022 can be different from one another according to the particular applications of the microelectronic imager. The first and second optic members 1010 and 1020 together define discrete optics elements 1050 at the device sites 320.

The first section 1002 can be formed by molding a material to shape the first optic members 1010 on a base 1014. The base 1014 can be characterized as a substrate in the sense that it interconnects the first optic members 1010 to form an integrated unit for wafer level processing. Alternatively, the first section 1002 can be formed by etching the first optic members 1010 from a substrate. The second section 1004 can be formed by etching or molding the second optic members 1020 in a manner similar to the first section 1002. The first and second sections 1002 and 1004 are then assembled to form the optical device assembly 1000.

The optical device assembly 1100 shown in FIG. 11 illustrates another combination of components. The optical device assembly 1100 includes the substrate 310, a first section 1102 having a plurality of first optic members 1110 on one side of the substrate 310, and a second section 1104 having a plurality of second optic members 1120 on the other side of the substrate 310. The first section 1102 can be similar to the molded optics elements 550 shown in FIGS. 5 and 6, or the etched optics elements 750 shown in FIG. 7B. The optic members 1120 of the second section 1104 can be similar to the optics elements 850 shown in FIG. 8B or the optics elements 950 shown in FIG. 9B.

Figure 12:
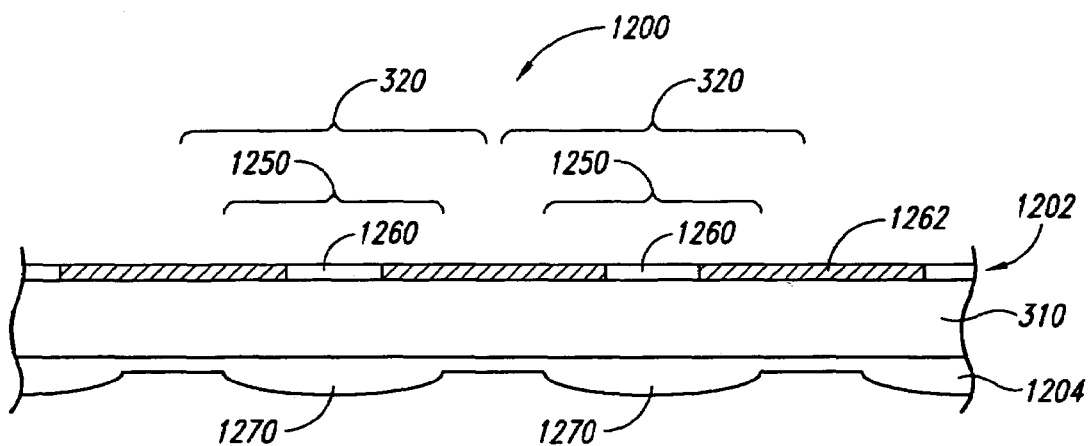
FIG. 12 is a schematic cross-sectional view illustrating an optical device assembly in accordance with another embodiment of the invention.

FIG. 12 is a schematic cross-sectional view illustrating another optical device assembly 1200 in accordance with another embodiment of the invention. The optical device assembly 1200 includes the substrate 310 with the device sites 320 and a plurality of optics elements 1250 at the device sites 320. The optics elements 1250 can include a first section 1202 and a second section 1204. The first section 1202 provides a plurality of pin-hole apertures 1260 defined by openings in a layer 1262. The second section 1204 can include a plurality of second optic members 1270. The first optic members 1260 and the second optic members 1270 together define the optics elements 1250. The second optic members 1270 can be formed according to any of the embodiments for constructing the optics elements shown in FIGS. 3A-11.

From the foregoing, it will be appreciated that specific embodiments of the invention have been described herein for purposes of illustration, but that various modifications may be made without deviating from the spirit and scope of the invention. For example, the pin-hole lenses shown in FIG. 12 can be combined with any of the optical device assemblies shown in FIGS. 3A-11. Additionally, the term substrate can include wafer-like substrates and/or molded base sections of the optical device assemblies. Accordingly, the invention is not limited except as by the appended claims.

We claim:

1. An optical device assembly comprising:
a first plurality of individual optical devices on a single first substrate, each individual optical device comprising an optics element configured to alter the direction of radiation passing through the optical device, the optics element of one optical device being separated from the optics element of an adjacent optical device by a first cutting lane;
a plurality of imaging units corresponding to the first plurality of optical devices on a single second substrate, each imaging unit comprising an image sensor and a stand-off, the stand-off of one imaging unit being separated from the stand-off of an adjacent imaging unit by a second cutting lane, and
a second plurality of individual optical devices on a single third substrate, wherein the third substrate is attached on top of the first substrate, wherein each individual optical device of the second plurality comprises an optics element configured to alter the direction of radiation passing through the optical device, wherein the optics element of one optical device is separated from the optics element of an adjacent optical device by a third cutting lane, and wherein optics elements of the second plurality of individual optical devices may be different from optics elements of the first plurality of individual optical devices,
wherein each optical device is attached to a corresponding imaging unit such that the optics element is spaced apart from the image sensor by the stand-off.

2. The optical device assembly of claim 1 wherein:
the stand-offs comprise a first referencing member;
the optical devices comprise a second referencing member; and
the first and second referencing members are complementary and configured for aligning and attaching each optical device to the corresponding imaging unit.

3. The optical device assembly of claim 1 wherein the individual optical devices and corresponding imaging units are separable from each other when the first and second substrates are cut along the first and second cutting lanes.

4. The optical device assembly of claim 1 wherein:
the first substrate comprises a wafer which is transmissive to light and has a first side and a second side; and
the optics elements comprise lenses on the first side of the wafer at the individual device sites, wherein each lens has a curved surface to refract radiation.

5. The optical device assembly of claim 4 wherein the lenses are molded elements having a curved surface.

6. The optical device assembly of claim 4 wherein the lenses are etched elements having a curved surface.

7. The optical device assembly of claim 4 wherein the lenses are separate components each having a curved surface and each lens is separate from the other lenses when attached to the wafer.

8. The optical device assembly of claim 4 wherein each optical device further comprises a filter.

9. The optical device assembly of claim 4 wherein the first substrate further comprises a non-transmissive layer and the optics elements further comprise pin-hole apertures in the non-transmissive layer at the individual device sites.

10. The optical device assembly of claim 1 wherein:
the first substrate comprises a wafer which is transmissive to light and has a first side and a second side; and
the optics elements comprise lenses at the individual device sites, each of the lenses having a first lens member on the first side of the wafer and a second lens member on the second side of the wafer.

11. A method of packaging a plurality of optical devices for use in microelectronic imagers, comprising:
providing a first substrate having a plurality of optics elements configured to manipulate radiation, wherein the first substrate is transmissive to a desired radiation and the optics elements are located at corresponding individual device sites of the first substrate to form a plurality of discrete optical devices;
providing an imager workpiece comprising a second substrate having a plurality of individual dies with imaging sensors;
forming a plurality of discrete stand-offs on at least one of the first substrate and the second substrate;
attaching the other of the first substrate and the second substrate to the stand-offs to space the first substrate apart from the second substrate by the stand-offs with each optical device being in optical communication with a corresponding imaging sensor;
providing a third substrate, the third substrate having a second plurality of optics elements configured to manipulate radiation, wherein the third substrate is transmissive to a desired radiation and the second plurality of optics elements are located at corresponding individual device sites of the third substrate to form a second plurality of discrete optical devices; and
attaching the third substrate on top of the first substrate.

12. The method of claim 11 wherein:
the first substrate comprises a first wafer that is transmissive to light;
the second substrate comprises a second wafer;
the plurality of stand-offs are formed on the second substrate; and
the first wafer is attached directly to the stand-offs formed on the second substrate.

13. The method of claim 12, further comprising forming a filter over the first wafer.

14. The method of claim 11 wherein:
the first substrate comprises a first wafer that is transmissive to light;
the second substrate comprises a second wafer;
the plurality of stand-offs are formed on the second substrate, each stand-off comprising a first referencing member;
the first substrate comprises a plurality of second referencing members which are complementary to and correspond with the first referencing members; and
each corresponding first and second referencing members are attached such that the optics elements are separated from the imaging sensors at a desired distance.

15. The method of claim 11 further comprising singulating the optical devices and their corresponding imager workpieces.

16. The method of claim 15 wherein the singulating step occurs after the attaching step.

17. The method of claim 15 wherein the singulating step comprises:
cutting the second substrate along a first cutting lane before the attaching step; and
cutting the first substrate along a second cutting lane after the attaching step.

18. The method of claim 15 wherein the singulating step comprises: cutting the first substrate along a first cutting lane before the attaching step; and cutting the second substrate along a second cutting lane after the attaching step.

19. The method of claim 11 wherein:
the first substrate comprises a first wafer that is transmissive to light; and
the plurality of optics elements comprise lenses formed on the first substrate at the individual device sites, wherein each lens has a curved surface to refract radiation.

20. The method of claim 19 wherein the lenses are molded onto the first wafer.

21. The method of claim 19 wherein the lenses are etched into the first wafer.

22. The method of claim 19 wherein the first substrate further comprises a layer of lens material on the first wafer and the lenses are etched into the layer of lens material.

23. The method of claim 11 wherein providing the first substrate having the plurality of optics elements comprises forming a plurality of lenses separate from the first substrate and attaching one of the plurality of lenses to the first substrate at each individual device site, wherein the lenses have a curved surface to refract radiation.

24. The method of claim 11, further comprising providing a non-transmissive layer on the first substrate and forming pin-hole apertures in the non-transmissive layer at the individual device sites.

25. A microelectronic imaging device assembly comprising:
an optical device assembly comprising a first substrate comprising a first wafer that is transmissive to light and having a plurality optics elements configured to manipulate radiation and comprising lenses located on the first substrate at the individual device sites, wherein each lens has a curved surface to refract radiation, each optical device further comprises a filter, wherein the first substrate is transmissive to a desired radiation and the optics elements are located at corresponding individual device sites of the first substrate to form a plurality of discrete optical devices;
an imager workpiece comprising a second substrate and a plurality of individual dies with imaging sensors; and
a plurality of discrete stand-offs between the first substrate and the second substrate, wherein the first substrate is attached to one end of each stand-off and the second substrate is attached to another end of each stand-off such that an optics element is in optical communication with a corresponding imaging sensor.

26. The imaging device assembly of claim 25 wherein:
the first substrate comprises a wafer that is transmissive to light;
the second substrate comprises a second wafer;
the plurality of stand-offs are formed on the second substrate; and
the first wafer is attached directly to the stand-offs formed on the second substrate.

27. The imaging device assembly of claim 25 wherein:
the first substrate comprises a wafer that is transmissive to light;
the second substrate comprises a second wafer;
the plurality of stand-offs are formed on the second substrate, each stand-off comprising a first referencing member;
the first substrate comprises a plurality of second referencing members, which are complementary to and correspond with the first referencing members; and
each corresponding first and second referencing members are attached such that the optical elements are separated from the imaging sensors at a desired distance.

28. The imaging device assembly of claim 25, wherein the plurality of optics elements comprises a plurality of lenses formed separately from the first substrate and attached to the first substrate at each device site, wherein the lenses have a curved surface to refract radiation.

29. An optical device assembly comprising:
a first plurality of individual optical devices on a single first substrate, each individual optical device comprising an optics element configured to alter the direction of radiation passing through the optical device, the optics element of one optical device being separated from the optics element of an adjacent optical device by a first cutting lane, wherein the first substrate comprises a wafer which is transmissive to light and has a first side and a second side and the optics elements comprise molded lenses on the first side of the wafer at the individual device sites, wherein each lens has a curved surface to refract radiation; and
a plurality of imaging units corresponding to the first plurality of optical devices on a single second substrate, each imaging unit comprising an image sensor and a stand-off, the stand-off of one imaging unit being separated from the stand-off of an adjacent imaging unit by a second cutting lane,
wherein each optical device is attached to a corresponding imaging unit such that the optics element is spaced apart from the image sensor by the stand-off, and one end of the standoff is attached to the first substrate and another end of the standoff is attached to the second substrate.

30. An optical device assembly comprising:
a first plurality of individual optical devices on a single first substrate, each individual optical device comprising an optics element configured to alter the direction of radiation passing through the optical device, the optics element of one optical device being separated from the optics element of an adjacent optical device by a first cutting lane, wherein the first substrate comprises a wafer which is transmissive to light and has a first side and a second side and the optics elements comprise etched lenses on the first side of the wafer at the individual device sites, wherein each lens has a curved surface to refract radiation; and
a plurality of imaging units corresponding to the first plurality of optical devices on a single second substrate, each imaging unit comprising an image sensor and a stand-off, the stand-off of one imaging unit being separated from the stand-off of an adjacent imaging unit by a second cutting lane,
wherein each optical device is attached to a corresponding imaging unit such that the optics element is spaced apart from the image sensor by the stand-off, and one end of the standoff is attached to the first substrate and another end of the standoff is attached to the second substrate.

31. An optical device assembly comprising:
a first plurality of individual optical devices on a single first substrate, each individual optical device comprising an optics element configured to alter the direction of radiation passing through the optical device, the optics element of one optical device being separated from the optics element of an adjacent optical device by a first cutting lane, wherein the first substrate comprises a wafer which is transmissive to light and has a first side and a second side and the optics elements comprise etched lenses on the first side of the wafer at the individual device sites and a non-transmissive layer and the optics elements further comprise pin-hole apertures in the non-transmissive layer at the individual device sites, wherein each lens has a curved surface to refract radiation; and a plurality of imaging units corresponding to the first plurality of optical devices on a single second substrate, each imaging unit comprising an image sensor and a stand-off, the stand-off of one imaging unit being separated from the stand-off of an adjacent imaging unit by a second cutting lane, wherein each optical device is attached to a corresponding imaging unit such that the optics element is spaced apart from the image sensor by the stand-off, and one end of the standoff is attached to the first substrate and another end of the standoff is attached to the second substrate.

32. A method of packaging a plurality of optical devices for use in microelectronic imagers, comprising:

providing a first substrate comprising a first wafer that is transmissive to light and having a plurality of optics elements configured to manipulate radiation and which comprise molded lenses formed on the first substrate at the individual device sites, wherein each lens has a curved surface to refract radiation, wherein the first substrate is transmissive to a desired radiation and the optics elements are located at corresponding individual device sites of the first substrate to form a plurality of discrete optical devices;

providing an imager workpiece comprising a second substrate having a plurality of individual dies with imaging sensors;

forming a plurality of discrete stand-offs on at least one of the first substrate and the second substrate; and attaching the other of the first substrate and the second substrate to the stand-offs to space the first substrate apart from the second substrate by the stand-offs with each optical device being in optical communication with a corresponding imaging sensor.

33. A method of packaging a plurality of optical devices for use in microelectronic imagers, comprising:

providing a first substrate comprising a first wafer that is transmissive to light and having a plurality of optics elements configured to manipulate radiation and which comprise etched lenses formed on the first substrate at the individual device sites, wherein each lens has a curved surface to refract radiation, wherein the first substrate is transmissive to a desired radiation and the optics elements are located at corresponding individual device sites of the first substrate to form a plurality of discrete optical devices;

providing an imager workpiece comprising a second substrate having a plurality of individual dies with imaging sensors;

forming a plurality of discrete stand-offs on at least one of the first substrate and the second substrate; and attaching the other of the first substrate and the second substrate to the stand-offs to space the first substrate apart from the second substrate by the stand-offs with each optical device being in optical communication with a corresponding imaging sensor.

34. A method of packaging a plurality of optical devices for use in microelectronic imagers, comprising:

providing a first substrate having a plurality of optics elements configured to manipulate radiation, wherein the first substrate is transmissive to a desired radiation and the optics elements are located at corresponding individual device sites of the first substrate to form a plurality of discrete optical devices, wherein said providing said first substrate comprises forming a plurality of lenses separate from the first substrate and attaching one of the plurality of lenses to the first substrate at each individual device site, wherein the lenses have a curved surface to refract radiation;

providing an imager workpiece comprising a second substrate having a plurality of individual dies with imaging sensors;

forming a plurality of discrete stand-offs on at least one of the first substrate and the second substrate; and attaching the other of the first substrate and the second substrate to the stand-offs to space the first substrate apart from the second substrate by the stand-offs with each optical device being in optical communication with a corresponding imaging sensor.

35. A method of packaging a plurality of optical devices for use in microelectronic imagers, comprising:

providing a first substrate having a plurality of optics elements configured to manipulate radiation, wherein the first substrate is transmissive to a desired radiation and the optics elements are located at corresponding individual device sites of the first substrate to form a plurality of discrete optical devices, wherein said providing said first substrate comprises forming a plurality of lenses separate from the first substrate and attaching one of the plurality of lenses to the first substrate at each individual device site, wherein the lenses have a curved surface to refract radiation;

providing an imager workpiece comprising a second substrate having a plurality of individual dies with imaging sensors;

forming a plurality of discrete stand-offs on at least one of the first substrate and the second substrate; and attaching the other of the first substrate and the second substrate to the stand-offs to space the first substrate apart from the second substrate by the stand-offs with each optical device being in optical communication with a corresponding imaging sensor.

36. A microelectronic imaging device assembly comprising:

an optical device assembly comprising a first substrate comprising a first wafer that is transmissive to light and having a plurality optics elements configured to manipulate radiation and comprising molded lenses located on the first substrate at the individual device sites, wherein each lens has a curved surface to refract radiation, each optical device further comprising a filter, wherein the first substrate is transmissive to a desired radiation and the optics elements are located at corresponding individual device sites of the first substrate to form a plurality of discrete optical devices;

an imager workpiece comprising a second substrate and a plurality of individual dies with imaging sensors; and a plurality of discrete stand-offs between the first substrate and the second substrate, wherein the first substrate is attached to one end of each stand-off and the second substrate is attached to another end of each stand-off such that an optics element is in optical communication with a corresponding imaging sensor.

37. A microelectronic imaging device assembly comprising:

an optical device assembly comprising a first substrate comprising a first wafer that is transmissive to light and having a plurality optics elements configured to manipulate radiation and comprising etched lenses located on the first substrate at the individual device sites, wherein each lens has a curved surface to refract radiation, each optical device further comprising a filter, wherein the first substrate is transmissive to a desired radiation and the optics elements are located at corresponding individual device sites of the first substrate to form a plurality of discrete optical devices;

an imager workpiece comprising a second substrate and a plurality of individual dies with imaging sensors; and a plurality of discrete stand-offs between the first substrate and the second substrate, wherein the first substrate is attached to one end of each stand-off and the second substrate is attached to another end of each stand-off such that an optics element is in optical communication with a corresponding imaging sensor.

* * * * *